US006233289B1

(12) United States Patent
Fredrickson

(10) Patent No.: US 6,233,289 B1
(45) Date of Patent: May 15, 2001

(54) HIGH RATE TRELLIS CODE FOR PARTIAL RESPONSE CHANNELS

(75) Inventor: Lisa Fredrickson, Ojai, CA (US)

(73) Assignee: Seagate Technolgy, Inc., Scotts Valley, CA (US)

( * ) Notice: Subject to any disclaimer, the term of this patent is extended or adjusted under 35 U.S.C. 154(b) by 0 days.

(21) Appl. No.: 08/895,126

(22) Filed: Jul. 16, 1997

Related U.S. Application Data

(60) Provisional application No. 60/021,947, filed on Jul. 17, 1996, and provisional application No. 60/041,069, filed on Mar. 18, 1997.

(51) Int. Cl.⁷ .................................................... H03D 1/00
(52) U.S. Cl. ........................ 375/341; 375/263; 714/809
(58) Field of Search .................................. 375/265, 263, 375/341, 290; 371/43.1, 43.4, 43.7, 52, 55, 37.08, 37.05, 43.6; 714/791, 808, 792, 759, 795, 806, 758, 809, 756; 708/532

(56) References Cited

U.S. PATENT DOCUMENTS

| | | | |
|---|---|---|---|
| 4,804,959 | * 2/1989 | Makansi et al. | 341/59 |
| 4,882,733 | * 11/1989 | Tanner | 371/43 |
| 5,073,940 | * 12/1991 | Zinser et al. | 704/226 |
| 5,095,484 | 3/1992 | Karabed et al. | 371/30 |
| 5,257,272 | 10/1993 | Fredrickson | 371/43 |
| 5,258,987 | * 11/1993 | Wei | 714/758 |
| 5,280,489 | 1/1994 | Fredrickson et al. | 371/45 |
| 5,416,804 | * 5/1995 | Khaled et al. | 371/37.4 |
| 5,434,886 | * 7/1995 | Kazawa et al. | 375/262 |
| 5,559,561 | * 9/1996 | Wei | 348/470 |
| 5,608,397 | * 3/1997 | Soljanin | 341/58 |
| 5,646,950 | * 7/1997 | Varanasi et al. | 371/43 |
| 5,691,995 | * 11/1997 | Ikeda et al. | 714/786 |
| 5,729,557 | * 3/1998 | Gardner et al. | 714/774 |
| 5,729,560 | * 3/1998 | Hagenaeur et al. | 371/43.1 |
| 5,809,081 | * 9/1998 | Karabed et al. | 371/43.1 |
| 5,949,796 | * 9/1999 | Kumar | 370/529 |

OTHER PUBLICATIONS

R.W. Karabed and P.H. Siegel, Matched Spectral Null Codes For Partial Response Channels, IEEE Trans. Info. TH vol. 37, No. 3, pp. 818–855, May 1991.

R.W. Wood, Viterbi Reception of Miller–Squared Code on the Tape Channel, Proc. 4th Int. Conf. Video and Data Recording, IERE Conf. Proc. 54, South Hampton, England, Apr., 1982, pp. 333–343.

* cited by examiner

*Primary Examiner*—Chi H. Pham
*Assistant Examiner*—Emmanuel Bayard
(74) *Attorney, Agent, or Firm*—Joseph R. Kelly; Westman, Champlin & Kelly, P.A.

(57) ABSTRACT

Signals indicative of unencoded input data are encoded into a plurality of encoded sequences. A first subset of the plurality of encoded sequences are encoded according to a k constrained code of rate x/y and a second subset of the plurality of unencoded sequences are encoded according to a k constrained code of rate m/n wherein $x/y \neq m/n$. The encoded sequences are transmitted to a partial response channel subject to noise. The encoded sequences are transmitted from the channel to a Viterbi detector having a trellis structure with a preselected, time-dependent pattern to create a time varying trellis structure for limiting a maximum length of parallel paths therethrough. The encoded sequences are detected with a Viterbi detector to provide detected, encoded sequences. The detected, encoded sequences are then decoded to provide an estimate of the input data.

29 Claims, 16 Drawing Sheets

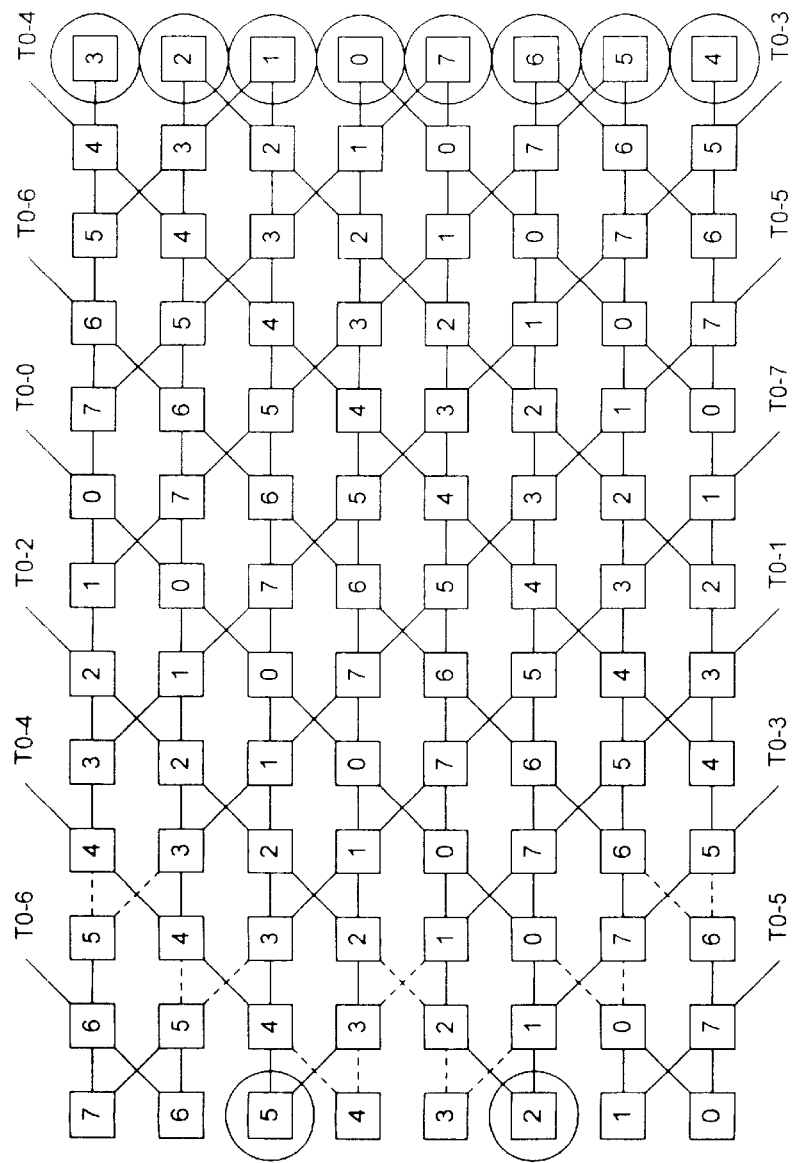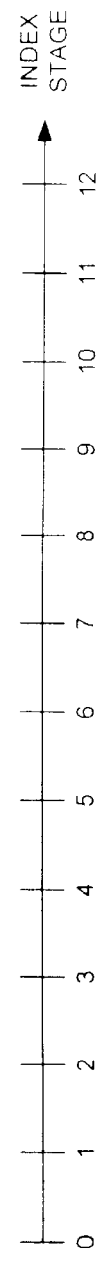
Fig. 3

HIGH RATE TRELLIS CODE FOR PARTIAL RESPONSE CHANNELS

REFERENCE TO RELATED APPLICATION

The present application is based on a provisional application Ser. No. 60/021,947 filed on Jul. 17, 1996 and provisional application Ser. No. 60/041,069 filed on Mar. 18, 1997.

BACKGROUND OF THE INVENTION

The present invention relates to disc drives. More particularly, the present invention relates to trellis codes used in encoding, detecting, and decoding data in a partial response channel.

A typical disc drive includes one or more magnetic discs mounted for rotation on a hub or spindle. A typical disc drive also includes a transducer supported by a hydrodynamic air bearing which flies above each magnetic disc. The transducer and the hydrodynamic air bearing are collectively referred to as a data head. A drive controller is conventionally used for controlling the disc drive based on commands received from a host system. The drive controller controls the disc drive to retrieve information from the magnetic discs and to store information on the magnetic discs.

An electromechanical actuator operates within a negative feedback, closed-loop servo system. The actuator moves the data head radially over the disc surface for track seek operations and holds the transducer directly over a track on the disc surface for track following operations.

Information is typically encoded and stored in concentric tracks on the surface of magnetic discs by providing a write signal to the data head to encode flux reversals on the surface of the magnetic disc representing the data to be stored. In retrieving data from the disc, the drive controller controls the electromechanical actuator so that the data head flies above the magnetic disc, sensing the flux reversals on the magnetic disc, and generating a read signal based on those flux reversals. The read signal is typically conditioned and then decoded by a read channel or the drive controller to recover data represented by flux reversals stored on the magnetic disc, and consequently represented in the read signal provided by the data head.

A typical communication channel represented by such a disc drive includes an encoder which encodes user input data, the data head, the medium (e.g., the magnetic or optical disc), preconditioning logic (such as amplifiers, filters, a gain loop, a sampler, a timing loop, and clock generation), a data detector, and a decoder for decoding the detected data to provide an output indicative of estimated user data.

A Viterbi detector has been investigated in the past for use as a data detector in a disc drive channel. A Viterbi detector acts as a maximum-likelihood sequence estimator when the input to the detector consists of a signal plus additive white, Gaussian noise, and when a typical branch metric (the square of the error in the signal provided to the detector) is used. Viterbi detectors conventionally operate according to a trellis structure. Trellis codes have been implemented in class-four partial response channels (PR4), with channel polynomials $1-D^2$, which can be thought of as the interleaving of two dicode channels, each with channel polynomial $1-D$. Many of these trellis codes provide independent coding and detection of each interleave. Previous trellis codes have encountered practical implementation obstacles which have limited the practical code rates attainable. One such previous implementation obstacle has been the design of a small encoder-decoder for the code.

Channel codes are typically characterized by the code rate, run length constraints, and distance properties of the code. In NRZI notation, a channel input of one corresponds to the recording of a magnetic medium transition, while a zero corresponds to no recorded transition. A (d,k) code refers to a constrained code with a minimum number d of zeros between ones and a maximum number of, at most, k zeros between ones in an NRZ encoded bit stream. Thus, for example, (0, k) code refers to a constrained code where there is no minimum constraint on the number of zeros between ones and there is a maximum constraint of, at most, k, zeros between ones in an NRZ encoded bit stream. Also, the notation (0, G/I) is sometimes used for PR4 channel codes, where I represents the maximum number of the consecutive zeros in each interleave of the two dicode channel streams, and G represents the maximum number of consecutive zeros in the combination of the two dicode channel streams.

Many communication systems, including disc drives, use matched spectral null (MSN) coding techniques in implementing a trellis code in a detector. MSN coding techniques involve determining the spectral nulls of a channel (the particular frequencies at which the channel power spectrum is zero), using a code to encode user input wherein the code has the same spectral nulls as those identified for the channel, and modifying the Viterbi detector to implement the code on the particular channel given any constraints placed thereon.

Spectral null sequences can be generated or represented in any of the following ways, which are relevant to the present invention.

First, the spectral null sequences can be represented by diagrams that reflect a bound on the accumulated charge or the running digital sum. This type of representation is described in greater detail in R. W. Wood, *Viterbi Reception of Miller-Squared Code on the Tape Channel*, PROC. 4th Int. Conf. Video and Data Recording, IERE Conf. PROC. 54, South Hampton, England, April, 1982, pages 333–343. Such spectral null sequences are typically generated by a finite state machine, such as that disclosed in U.S. Pat. No. 4,888,779, issued to R. W. Karabed and P. H. Siegel, entitled MATCHED SPECTRAL NULL TRELLIS CODES FOR PARTIAL RESPONSE CHANNELS, and issued on Dec. 19, 1989.

Second, spectral null sequences can also be generated at the output of a sampled partial-response channel (typically represented as a digital filter) where the channel frequency response has a null at a particular frequency. Such a system is described in the Karabed and Siegel '779 patent mentioned above.

In addition, the two above approaches can be combined. In essence, matched spectral null coding is used for a partial response channel. Such a system is set out in the Karabed and Siegel patent mentioned above, and also in R. W. Karabed and P. H. Siegel, *Matched Spectral Null Codes For Partial Response Channels*, IEEE Trans. Info. TH Vol. 37, No 3, pp. 818–855, May 1991.

Spectral null sequences have been shown to contain certain inherent distance properties that can improve the reliability of their recovery from data samples generated at the output of a noisy communications channel, such as a disc drive. It has also been demonstrated that, at moderate to high signal-to-noise ratios, performance that is equivalent to that of a maximum-likelihood detector can be achieved by applying the algorithm executed by a Viterbi detector to a reduced-complexity trellis that tracks the spectral content of sequences, and the memory of the partial response channel.

Particularly, the free distance of a particular detector trellis (sometimes referred to as the free distance) is defined as the minimum sum of the squared differences between noiseless sample values resulting from two distinct sequences that diverge from a common state on the trellis and remerge to a common state. For partial response, maximum likelihood detection (PRML detection), the free distance is two, but the first order matched spectral null codes described by U.S. Pat. No. 4,888,779 granted on Dec. 19, 1989, increased the free distance to four. Other coding constraints are generally imposed which improve the reliability of data recovery. Such codes include the incorporation of conventional (d, k) run length constraints.

The likelihood of Viterbi detector error events decreases as a function of the free distance. The maximum length of dominant error events encountered by the Viterbi detector is determined by the length of the parallel paths in the trellis that do not accumulate distance. Sequences which correspond to parallel paths through a trellis which do not accumulate distance are referred to as quasicatastrophic sequences. In essence, two parallel paths through the trellis can represent two codewords which are equidistant from the actual measured values. Thus, the Viterbi detector has more difficulty while the paths remain parallel in determining which is the correct path through the trellis.

One solution to the problem encountered with quasicatastrophic sequences is to use coding techniques to impose constraints on the channel output sequences in order to prevent the occurrence of quasicatastrophic trellis sequences. Such coding constraints may require, for example, a coded path with a parallel path to periodically migrate to one of the trellis borders until the parallel path collides with the trellis border and is forced to take a direction which causes the path to become non-parallel.

This approach is adequate in some instances. However, potential drawbacks are associated with this approach. First, for particularly high-rate codes, the encoder and the decoder functions may entail additional complexity. Also, while the maximum length of quasicatastrophic sequences is guaranteed to be bounded above by a fixed finite number, it may still be too long for a particular application.

In order to overcome these disadvantages, another technique has been discussed by Fredrickson et al. in U.S. Pat. No. 5,280,489. That patent describes Viterbi detectors for matched spectral null codes with a trellis structure in which a predetermined number of states and edges are deleted in a preselected time-dependent pattern to create a time-varying trellis which significantly limits the maximum length of minimum distance error events. In other words, the trellis structure implemented by the detector periodically (i.e., in a time-dependent fashion) pairs down to a group of preselected states chosen such that parallel paths through the trellis structure (which do not violate k constraints placed on the code) must become non-parallel upon reaching, or before reaching, the preselected states.

In addition, U.S. Pat. No. 5,257,272, issued to Fredrickson on Oct. 26, 1993 makes further advances. In that reference, a Viterbi detector is described which provides a time-varying trellis structure for a run length limited (RLL) code, wherein only certain values of a preselected attribute tracked modulo N are allowed every M bits, to increase the minimum distance between output sequences of a partial response channel and to eliminate quasicatastrophic sequences.

Many problems still exist in obtaining high code rate trellis codes for relevant channels which can be adequately constrained and limited to improve performance, but which can also be practically implemented.

SUMMARY OF THE INVENTION

Signals indicative of unencoded input data are encoded into a plurality of encoded sequences. A first subset of the plurality of encoded sequences are encoded according to a k constrained code of rate x/y and a second subset of the plurality of unencoded sequences are encoded according to a k constrained code of rate m/n wherein x/y≠m/n. The encoded sequences are transmitted to a partial response channel subject to noise. The encoded sequences are transmitted from the channel to a Viterbi detector having a trellis structure with a preselected, time-dependent pattern to create a time varying trellis structure for limiting a maximum length of parallel paths therethrough. The encoded sequences are detected with a Viterbi detector to provide detected, encoded sequences. The detected, encoded sequences are then decoded to provide an estimate of the input data.

BRIEF DESCRIPTION OF THE DRAWINGS

FIG. 3 illustrates a trellis structure for a first rate 11/12 encoded sub-block.

DETAILED DESCRIPTION OF THE PREFERRED EMBODIMENTS

Figure 1:
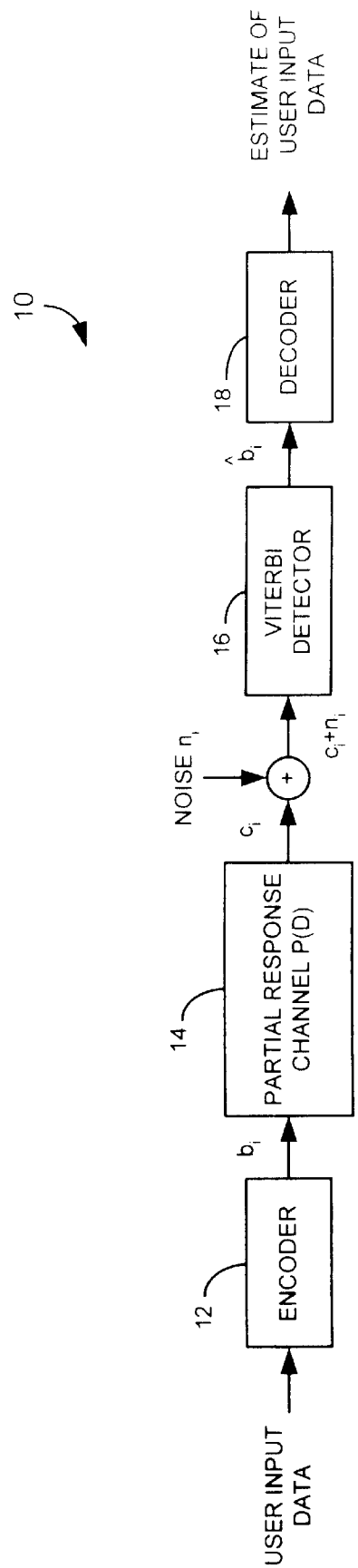
FIG. 1 is a block diagram of a data storage system.

FIG. 1 illustrates a data transmission system 10 which includes encoder 12, partial response channel 14, Viterbi detector 16 and decoder 18. Input data is transmitted, preferably in the form of binary symbol strings, to encoder 12. Encoder 12 encodes the input data into a plurality of encoded sequences and provides the encoded sequences to partial response channel 14. For each partial response channel polynomial P(D), the channel state consists of the most recent j NRZ channel input bits, where j is the degree of the polynomial. A channel output is provided by partial response channel 14, corrupted by noise, and provided to Viterbi detector 16. Detector 16 calculates and estimates, based on the output from partial response channel 14, the most probable encoded sequence received by partial response channel 14. Decoder 18 receives the probable coded sequence provided by Viterbi detector 16, and decodes that sequence, to recover an estimate of the original input data provided to encoder 12.

The trellis code contemplated by the present invention is a practical implementation of a high rate code (such as a rate 8/9 code) which equals a standard PR4 code rate using a non-trellis code. The code introduced by the present invention is preferably implemented by the bit interleaving of two independently coded sequences each of which is a 0,3 constrained sequence. The preferable interleaved coded sequence is commonly referred to as (0,6/3) code, which is an improvement over previous lower code rate trellis codes, and which is comparable with standard PR4 code constraints, such as (0,4/4). The minimum distance of the present code is 4, which is the same as previous lower rate trellis codes for the dicode channel, and which constitutes a significant improvement over PRML detection with distance 2. This doubling of distance increases the noise immunity of the trellis coded channel by 3 dB asymptotically.

Figure 2:
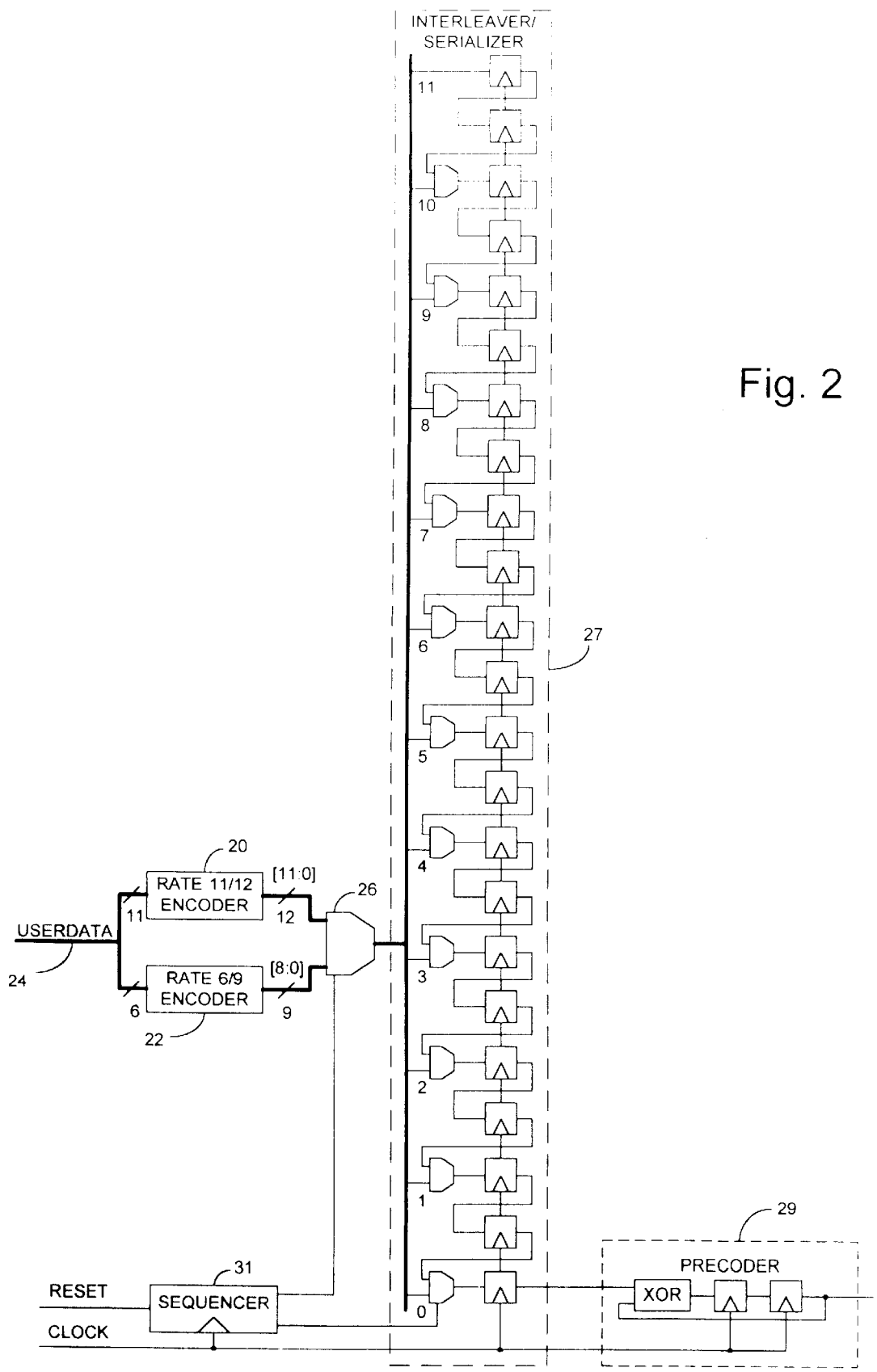
FIG. 2 is a more detailed block diagram of an encoder in accordance with one preferred embodiment of the present invention.

In the preferred embodiment, the present code imposes certain constraints on the detector as a function of time. A code block preferably consists of six sub-blocks coded independently at a rate of 11/12, followed by a single state-dependent coded sub-block at rate 6/9. FIG. 2 is a block diagram illustrating one preferred embodiment of an encoder 12 in accordance with one aspect of the present invention. In FIG. 2, encoder 12 includes a first rate 11/12 encoder 20, and a second rate 6/9 encoder 22. Encoders 20 and 22 are coupled to the input data stream by a parallel data bus 24 and are coupled to the PR channel by a multiplexer 26, interleaver-serializer 27 (formed by a plurality of multiplexers and registers) and a pre-coder 29 (formed by an Exclusive OR fate, and two output registers with feedback). In the preferred embodiment, a sequencer 31 controls the multiplexers so that in each interleave the rate 11/12 encoder is used for six consecutive sub-blocks followed by a single use of the rate 6/9 encoder. The 2–81 bit blocks for the two interleaves are bit wise interleaved in interleaver-serializer 27. Pre-coder 29 converts the interleaved NRZI to NRZ for input to the partial response channel.

All of the encoded sub-blocks preferably contain at most three consecutive NRZI zeros. Additionally, each encoded sub-block preferably begins with at most one consecutive zero, and ends with at most two consecutive zeros. Therefore, the encoded sub-blocks are able to be freely concatenated, without violating a k=3 constraint at encoded sub-block boundaries.

Table 1 is a list of all 12 bit codewords with at most three consecutive NRZI zeros which begin with at most one zero, and end with at most two consecutive zeros. A code with k=3 of rate 11/12 is obtained by freely concatenating codewords from Table 1, or by using codewords whose bits are reversed in order from those in Table 1.

Choosing of the appropriate encoded rate 6/9 sub-block is time dependent. Therefore, state sequences $S_i$ for the trellis structure (described in greater detail below) must be taken into account. For each binary NRZI channel input sequence $\{b_1, b_3 \ldots\}$, let the state sequence $\{S_i\}$ be defined, where $S_0=2$, as follows:

$S_{i-1}$, if $S_{i-1}$ is even and $b_i$ is 0;
$(S_{i-1}+6)$ modulo 8 if $S_{i-1}$ is odd and $b_i$ is 0; and
$(S_{i-1}+7)$ modulo 8 if $b_i$ is 1.

Then, for the first 72 bits of each code block, the state sequence $S_i$ is updated. One of four rate 6/9 code tables is preferably used to produce the last sub-block, depending on the value of $S_i$. The last sub-blocks are chosen to ensure that the ending value of $S_i$ is one of a plurality of preselected state values (in this case either 2 or 5) after each code block of 81 bits. Table 2 lists all nine bit codewords with at most three consecutive NRZI zeros which would begin with at most one zero, and end with at most two consecutive zeros. A k=3 sub-block encoded at a rate of 6/9 is thus obtained. Table 2 is divided into four subtables (Tables 2A, 2B, 2C and 2D) each corresponding to certain values of $S_i$ after 72 bits of a code block. The values set out in Table 2A are sequences which can be used where $S_i=0$ or 1 after the first 72 bits. Table 2B illustrates sequences which can be used where $S_i=2$ or 7, Table 2C illustrates sequences which can be used where $S_i=3$ or 6, and Table 2D illustrates sequences which can be used where $S_i=4$ or 5.

Figure 4:
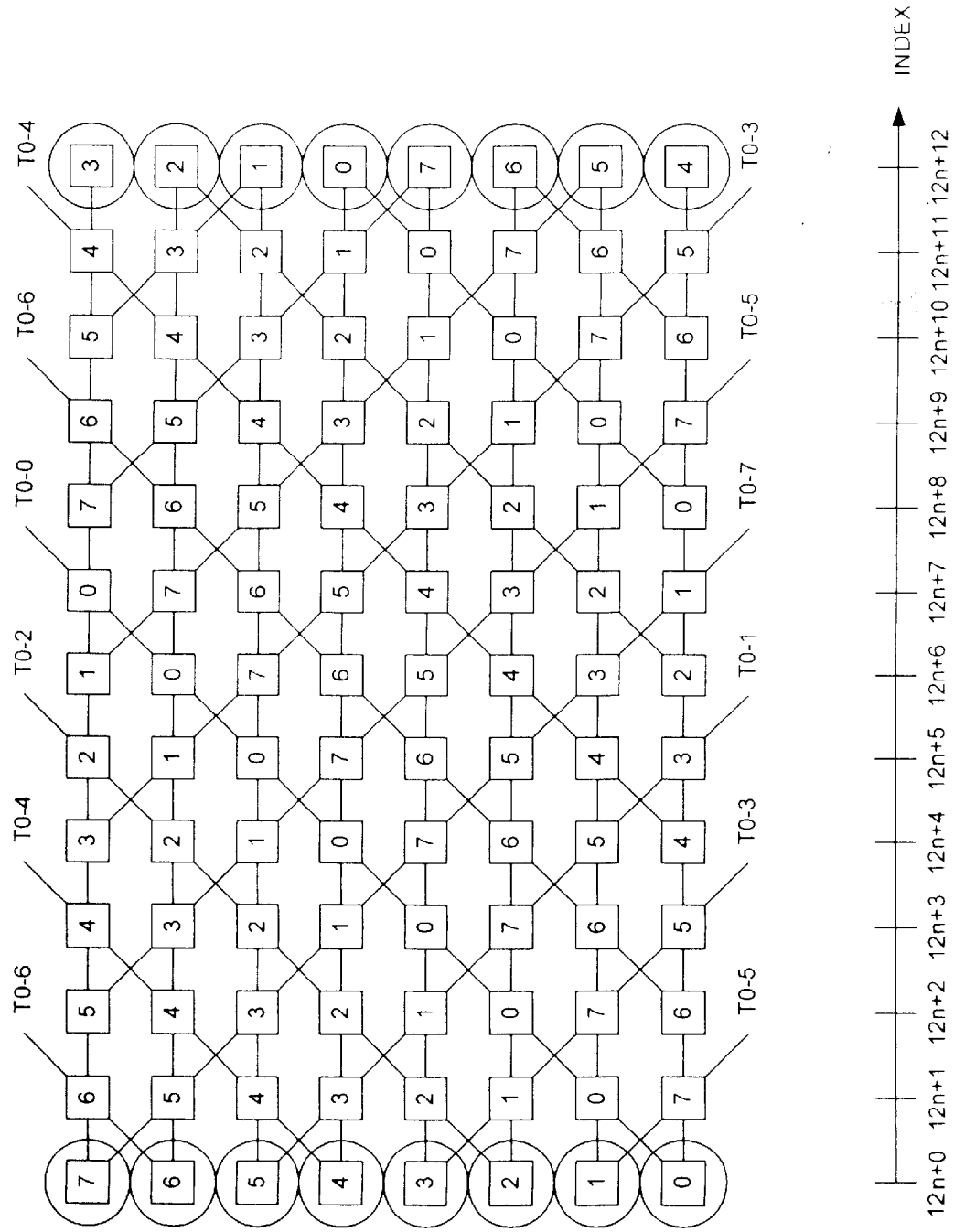
FIG. 4 illustrates a trellis structure for a plurality of intermediate rate 11/12 encoded sub-blocks.
Figure 5:
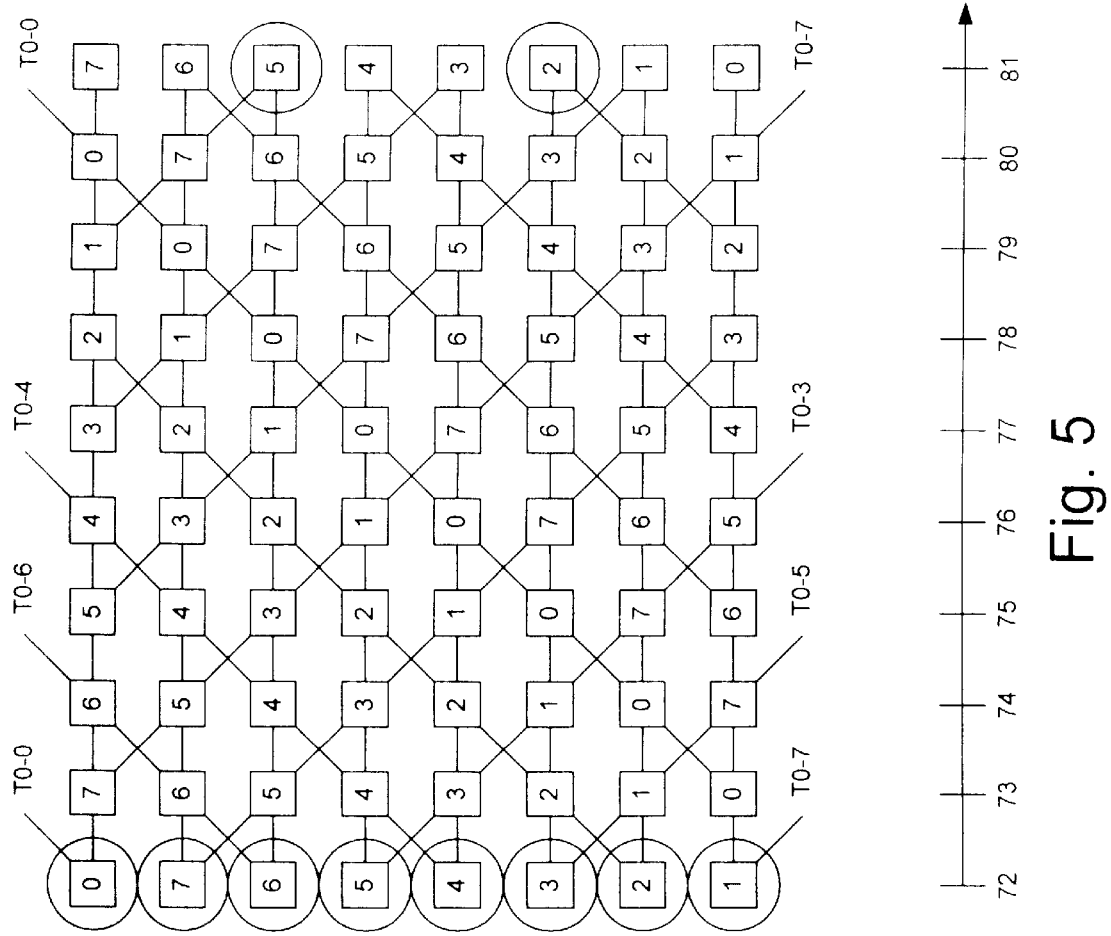
FIG. 5 illustrates a trellis structure for a rate 6/9 encoded terminating sub-block.

FIGS. 3–5 illustrate a trellis structure in accordance with one preferred embodiment of the present invention. FIGS. 3–5 illustrate that the detector includes eight states, each labeled with a possible value of $S_i$. The interconnection of the various states in the detector is illustrated in FIGS. 3–5. In all of these figures, a horizontal edge from one state label to another represents an NRZI 1, while a diagonal edge connecting one state label to another represents an NRZI 0. Edges emanating from the top or bottom of the figures wrap around, as indicated, to successor states at the bottom, or top, respectively, of the figures.

FIG. 3 illustrates a trellis structure for a first sub-block of rate 11/12 in a code block. Recall that the previous code block must have ended with a sub-block encoded at rate 6/9 wherein the final state was either 2 or 5. Thus, as illustrated in FIG. 3, the first state for the first sub-block in the subsequent code block is encoded at rate 11/12, and, at the beginning of each such sub-block, the possible values of $S_i$ are 2 and 5. These are illustrated in FIG. 3 as states with background circles at index time 0. At the end of the first sub-block illustrated in FIG. 3, all detector states are possible as indicated by background circles at index 12.

FIG. 4 illustrates a trellis structure corresponding to the intermediate rate 11/12 encoded sub-blocks, which are between the first sub-block, and the final rate 6/9 encoded sub-block. For the intermediate sub-blocks, all states are possible at codeword boundaries. This is illustrated by the shaded circles outlining the trellis states at the beginning and the end of the trellis structure in FIG. 4.

FIG. 5 illustrates a trellis structure for a final sub-block in a code block, encoded at rate 6/9, where all sequences through the trellis are preselected to end in either state 2, or state 5. Thus, on the input side of the trellis structure in FIG. 5, all states are possible as indicated by the shaded circles. However, on the output side of the trellis structure, only states 2 and 5 are possible. This trellis structure ensures the elimination of quasicatastrophic sequences, because parallel paths cannot be maintained through the terminating sub-block so long as the other code constraints are observed.

Because of the run length limitations and the initial state constraints within each sub-block, certain edges and states in the trellis structure are never used by coded sequences. Thus, these can be eliminated in the detector. In FIGS. 3–5, such edges are illustrated as dashed lines.

Figure 6:
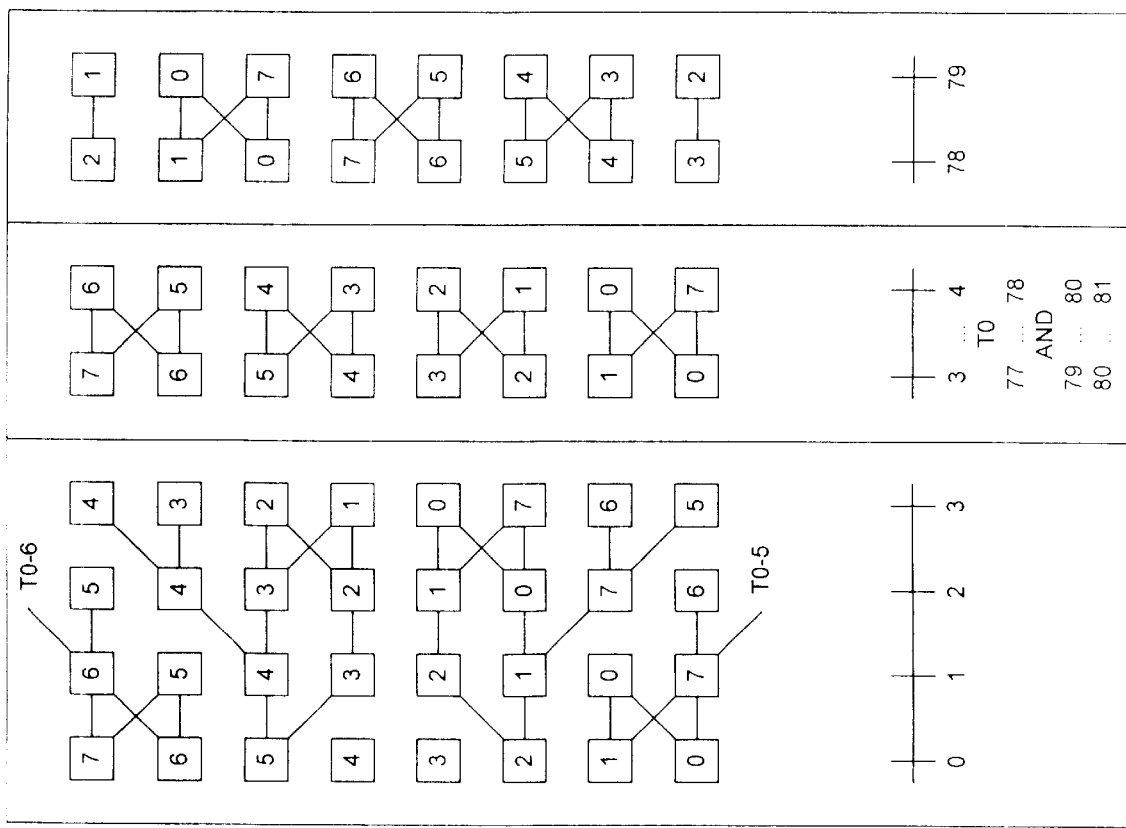
FIG. 6 illustrates a trellis structure from which a detector pre-biasing circuit is implemented.

Detector 16 incorporates a pre-biasing of conventional add-compare units of the Viterbi detector, which eliminates selection of the dashed paths shown in FIGS. 3–5. The detector pre-biasing is summarized by FIG. 6, which illustrates all possible survivor paths allowed by pre-biasing detector 16. A pre-biasing circuit can be implemented, in a known manner, based on the trellis structures and pre-biasing summary provided in FIGS. 3–6. One way of implementing a pre-biasing structure to eliminate edges and states from the trellis structure is set out in greater detail in the Fredrickson et al. U.S. Pat. No. 5,280,489. FIG. 6 summarizes the pre-biasing by illustrating the remaining states and edges for time periods associated with bits (or index stages) 0–81 through the trellis structure.

Figure 7:
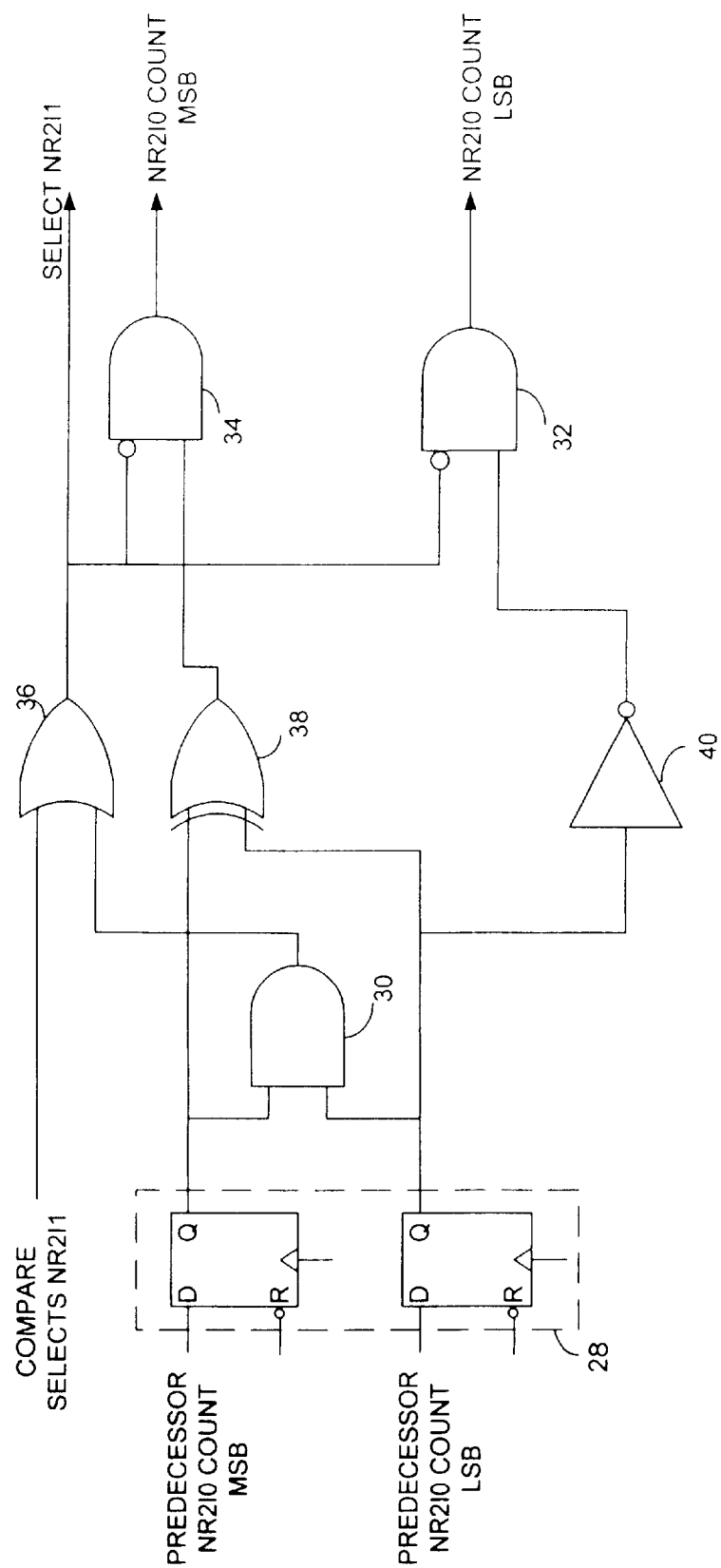
FIG. 7 is a block diagram of a dynamic bias circuit used in accordance with one aspect of the present invention.

In addition, in accordance with another aspect of the present invention, dynamic biasing is preferably used to feedback certain decisions made in detector 16 to ensure that the run length constraints are not violated. One such dynamic biasing circuit is illustrated in greater detail in FIG. 7. FIG. 7 includes counter 28, a plurality of AND gates 30, 32 and 34, OR gates 36 and 38, and inverter 40. In the preferred embodiment illustrated in FIG. 7, each state in the detector trellis is provided with a two-bit counter 28 which contains a value that represents the number of consecutive NRZI zeros observed in the detectors decisions leading to that state. In FIG. 7, it is assumed that each state in the trellis receives a two-bit count of the number of consecutive NRZI zero decisions made in the predecessor state. This is represented by the Predecessor NRZI Zero Count LSB and Predecessor NRZI Zero Count MSB signals in FIG. 7. This count is stored in counter 28, which is preferably implemented as a pair of flip flops with a negative asynchronous reset.

If the current count of consecutive NRZI zero decisions is three, the count in counter 28 is decoded by AND gate 30 and OR gate 36 and is used to force the selection, by the detector, of the path ending in an NRZI 1, and to reset the NRZI zero count, through AND gates 32 and 34, and through inverter 40. This helps to prevent detector 16 from selecting a sequence which is not in the code, instead of a sequence that may be in the code.

Table 3 illustrates four preferred implementations of encoder 12 and decoder 18, listed in the Verilog design language. Each is listed in terms of primitive AND, OR and not Boolean expressions. Each synthesizes to a parallel coder with relatively small area compared to previous implementations. For comparison, the four designs were synthesized using Synopsys in a chip vendors by CMOS logic family. The total gate count for the four designs is on the order of 500 equivalent NAND gates, as compared to a rate 12/15 prior art trellis code, which used approximately 1500 equivalent NAND gates for a lower rate trellis code.

It can now be seen that, by implementing the run length constraints, by encoding the codewords into sub-blocks having first higher code rates, and then terminating with a lower code rate sub-block, and by causing the detector to periodically (at the end of each code block) pare down to achieve a state corresponding to one of a preselected plurality of states, the present invention can be implemented to obtain a high code rate (8/9) while maintaining practical implementation, and while still eliminating quasi-catastrophic behavior characteristics from the code and detector.

Figure 8:
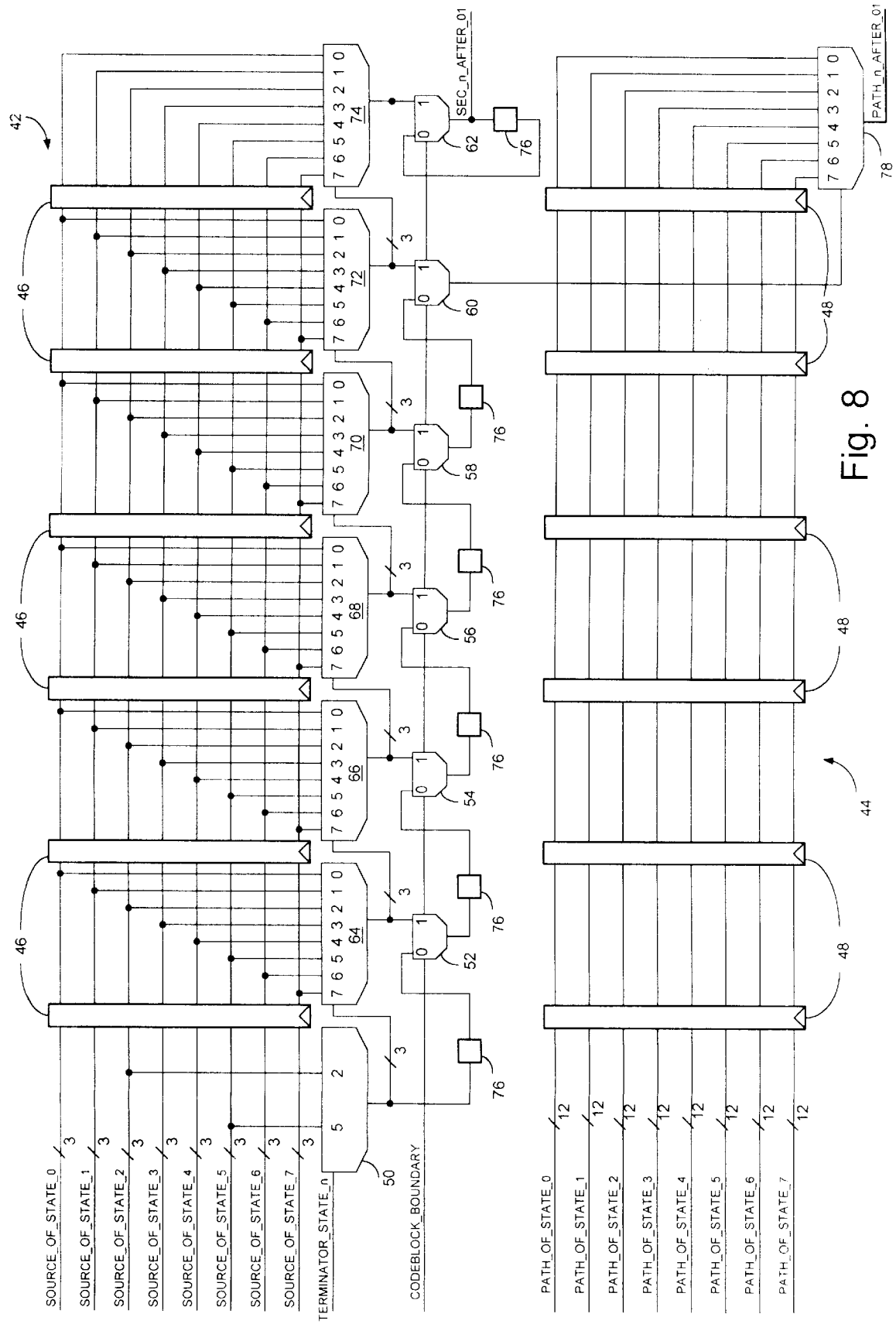
FIG. 8 is a block diagram of a trace back and global path memory circuit.

FIG. 8 illustrates a trace back and pointer memory circuit 42 and global data path memory circuit 44. Trace back circuit 42 and global data path memory circuit 44 implement an efficient path memory architecture.

Higher rate trellis codes tend to have longer path memory requirements and hence require efficiency in path memory organization to minimize cost and power. A standard technique of path memory management (not shown) is to provide simple register exchange path memories. In accordance with one aspect of the present invention, an effective path memory of 162 bits is provided, which consumes much less power than a conventional register exchange path memory architecture, operating at the bit rate of the system, which is 162×8 bits in size.

In accordance with one aspect of the present invention, the first 12 bits of each data path memory are obtained by a conventional register exchange methodology (not shown). Each of the 8 states in the trellis which represents the detector includes a 12 bit memory with a two-way multiplexer associated with each bit. In addition, each state includes a 3 bit pointer, which contains data bits that point to a source state at the last sub-block boundary. These pointers are initialized to their corresponding state labels at the boundary of each sub-block, and are then swapped in a register exchange for the duration of the sub-block. At the end of each sub-block, the path memory for each terminal state contains the most likely path to that terminal state, and the 3 bit pointer register for each terminal state indicates the source state of that path. The path memories and pointers comprise a 15×8=120 bit register exchange path memory operating at the bit rate of the system.

At each sub-block boundary, the contents of the register exchange memories enter a 120 bit by 7 bit delay line with no intervening multiplexers. This delay line is represented by registers 46 and 48 in trace back circuitry 42 and in global path memory 44. Track back circuit 42 includes six registers 46, each of which hold the 3 bit pointer data associated with each state of the trellis for a different stage or index time period corresponding to a different sub-block. Trace back circuit 42 also includes seven two input multiplexers 50, 52, 54, 56, 58, 60 and 62, and six eight input multiplexers 64, 66, 68, 70, 72 and 74. Global path memory circuit 44 also includes an eight input multiplexer 78.

Multiplexer 50 has, at its inputs, two sets of three bit pointer data, associated with states 2 and 5. The remainder of multiplexers 64–74, have as their inputs, the eight 3 bit sets of pointer data associated with each of the states in the trellis structure. Multiplexer 50 has as its select input, a TERMINATOR STATE N input signal, which is described in greater detail below. The output of multiplexer 50 is provided to register 76, and is also provided as the select input to multiplexer 64. The outputs of multiplexers 64–70 are each provided to a corresponding two input multiplexer (52–60) and as the select inputs to the next subsequent eight input multiplexer.

The outputs of each of the multiplexers 52–58 are provided to a register 76. The select inputs for each of the multiplexers 52–62 is a CODE BLOCK BOUNDARY signal described in greater detail below.

The output of multiplexer 72 is provided as the select input for multiplexer 74. It is also provided to multiplexer 60, the output of which is provided as the select input to multiplexer 78 in global path memory circuit 44.

The output of multiplexer 74 is provided to multiplexer 62 which has its output provided to register 76, the output of which is fed back to a second input of multiplexer 62.

The entire global pointer and data path memory which includes registers 46 and 48 is clocked at sub-block boundaries (i.e., 7 times per 81 channel bit period). It therefore consumes less than 7/81 of the power of a register exchange memory of the same size, which was used in conventional systems. The power in this section is roughly equivalent to (840×70)/81 which is ≈72.6 register exchange bits.

Multiplexers 50–74, shown in FIG. 8, provide a trace back throughout the path memory pointers to the source states for terminal states 2 and 5 shown in the trellis structure. After each period of 81 bits, control signal CODE BLOCK BOUNDARY is asserted. The same circuitry is used to trace both states 2 and 5, under the control of the TERMINATOR STATE N control line, which selects either the 12 bit paths source pointer of state 2 or state 5. This pointer is used to select the 24 bit path source pointer at the output of the second multiplexer 64. This continues recursively until the output of the sixth multiplexer 72 provides the pointer to select a 72 bit path source (i.e., the path source for the first sub-block of the code block for either state 2 or state 5). This is provided on the output bus PATH N AFTER 81. One additional stage of trace back, implemented with multiplexer 74, is also used to determine the source pointer after the 81 bit path.

On successive sub-block boundaries, the delay line which includes registers 46 and 48 is clocked, but the signal CODE BLOCK BOUNDARY is de-asserted. This causes the previously produced interim trace back results to be shifted through a 6×3 bit delay line which is comprised of registers 76. This selects the appropriate sub-block tracing back from state 2 or state 5 to the current global path memory output sub-block at the end of the delay which is comprised of registers 48.

Figure 9:
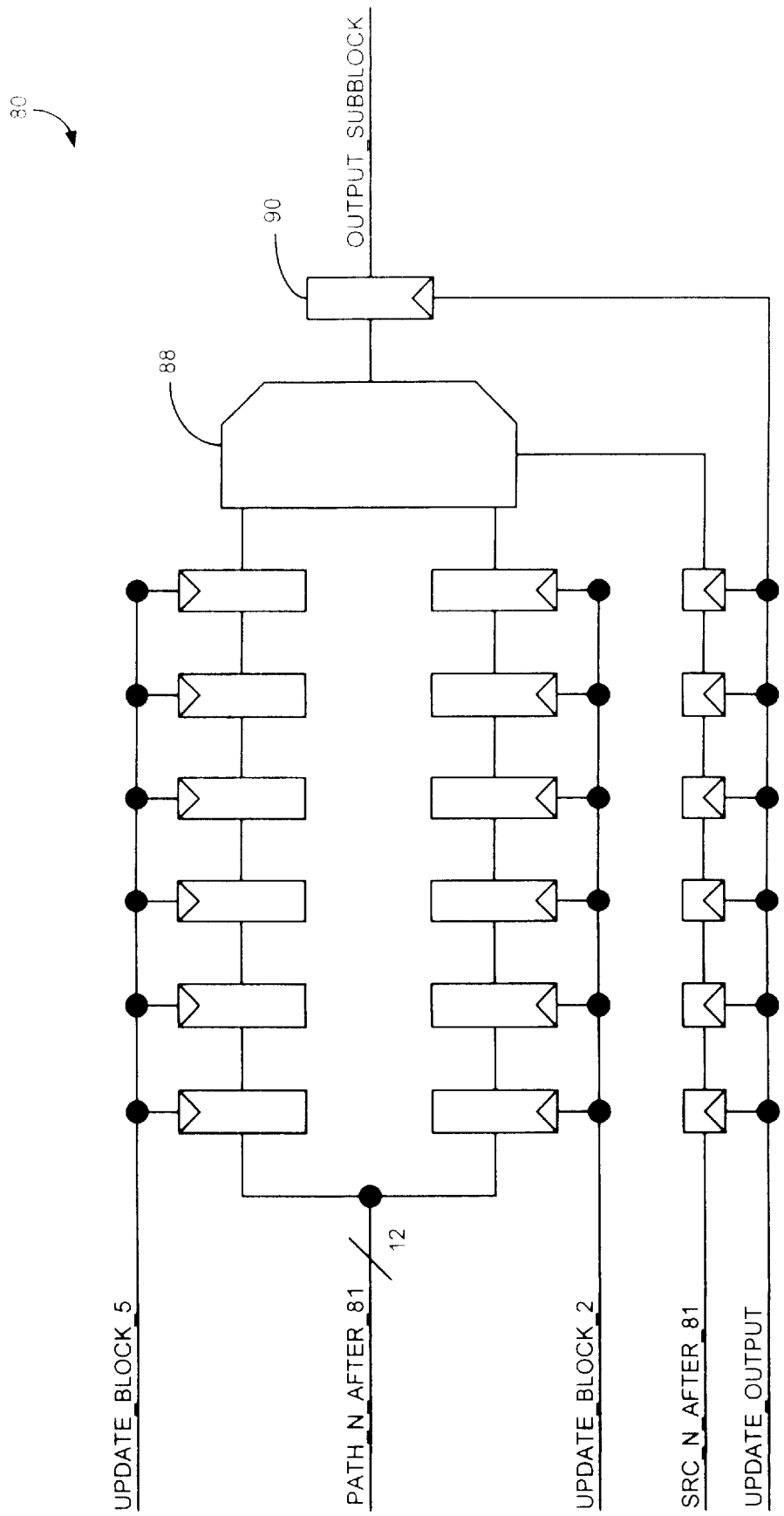
FIG. 9 is a block diagram of an output selector circuit.

The outputs SOURCE N AFTER 81 and PATH N AFTER 81 from circuits 42 and 44 are used to control a second delay line 80 illustrated in FIG. 9. Delay line 80 includes a first set of 12 bit registers 82, a second set of 12 bit registers 84, and a third set of 3 bit registers 86. The inputs to registers 82 and 84 are provided by the PATH N AFTER 81 signals, and the inputs to registers 86 are provided by the SOURCE N AFTER 81 signals. The output of registers 82 and 84 are provided to a multiplexer 88, and the select input to multiplexer 88 is provided by the source inputs from registers 86. The output of multiplexer 88 is provided to an additional 12 bit register 90. The registers are clocked at sub-block boundaries (i.e., 7 times per 81 bit channel period). There are a total of 180 bits stored in the registers of FIG. 9, so that the power in circuit 80 is roughly equivalent to (160×7)/81 which is ≈13.8 register exchange bits.

Two separate clock edges, UPDATE BLOCK 5 and UPDATE BLOCK 2 are used to update the registers for states 5 and 2, respectively. When the TERMINATOR STATE N control signal (shown in FIG. 8) is set for trace back of state 2, the UPDATE BLOCK 2 clock updates the registers in FIG. 9 for state 2. By contrast, when the TERMINATOR STATE N control signal in FIG. 8 is set for the trace back of state 5, the UPDATE BLOCK 5 clock updates the registers for block 5. Since there are multiple bit times to update the registers 82 and 84, clock signals are preferably gated in a glitch-free fashion to avoid the need for registers with feedback.

Of course, in the implementation of FIG. 9, it is assumed that the state metrics for state 2 and 5 are compared at the end of each block. The minimum metric state determines the first state traced back, by assertion or de-assertion of the TERMINATOR STATE N control signal. The UPDATE OUTPUT clock is coincident with the UPDATE BLOCK signals.

Total power consumption of the path memory is less than that of a 207 register exchange memory operating at the bit rate of the system, and therefore favorably compares with a 6×34=204 bit register exchange memory used in a previous rate 4/5 trellis code implementation.

Figure 10:
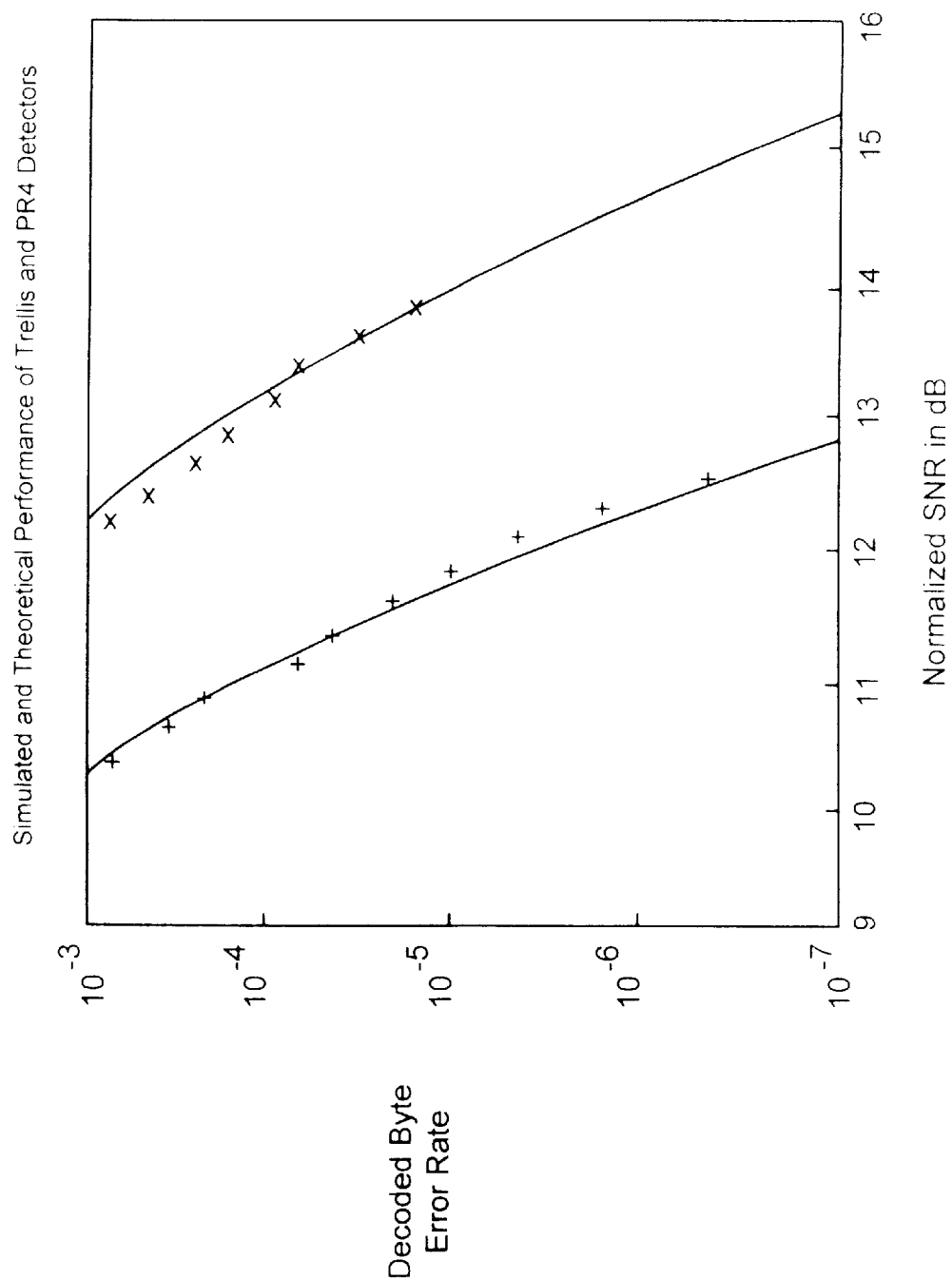
FIG. 10 illustrates a comparison of the performance of the first code, in terms of normalized signal-to-noise ratio, against the performance of a same rate PR4 detector.

FIG. 10 is a graph which illustrates the performance of the simulated performance curves for the rate 8/9 trellis code, detected by means of the trellis detector or by a standard dicode channel detector. FIG. 10 illustrates points which represent an observed simulation of decoded byte error rate as a function of signal to noise ratio in decibels. Each such point was obtained by observing 100 trellis decoded byte errors. The curves were loosely fitted to error functions which are shown as solid lines. The simulation verifies the predicted performance gains of the disclosed 8/9 trellis code or dicode or PRML channels. The run length constraints and coding gain provide improved performance over previously proposed codes, while maintaining the ability of the code to ensure reasonable complexity in implementation.

It should be noted that while the present code was presented as an 8/9 code, other code rates could also be used. Table 4 is a table which discloses a number, J, of rate 11/12 sub-blocks followed by 1 sub-block of rate 6/9, and the corresponding code rate, along with the number of user bits which are encoded, and the total coded block length.

Figure 11:
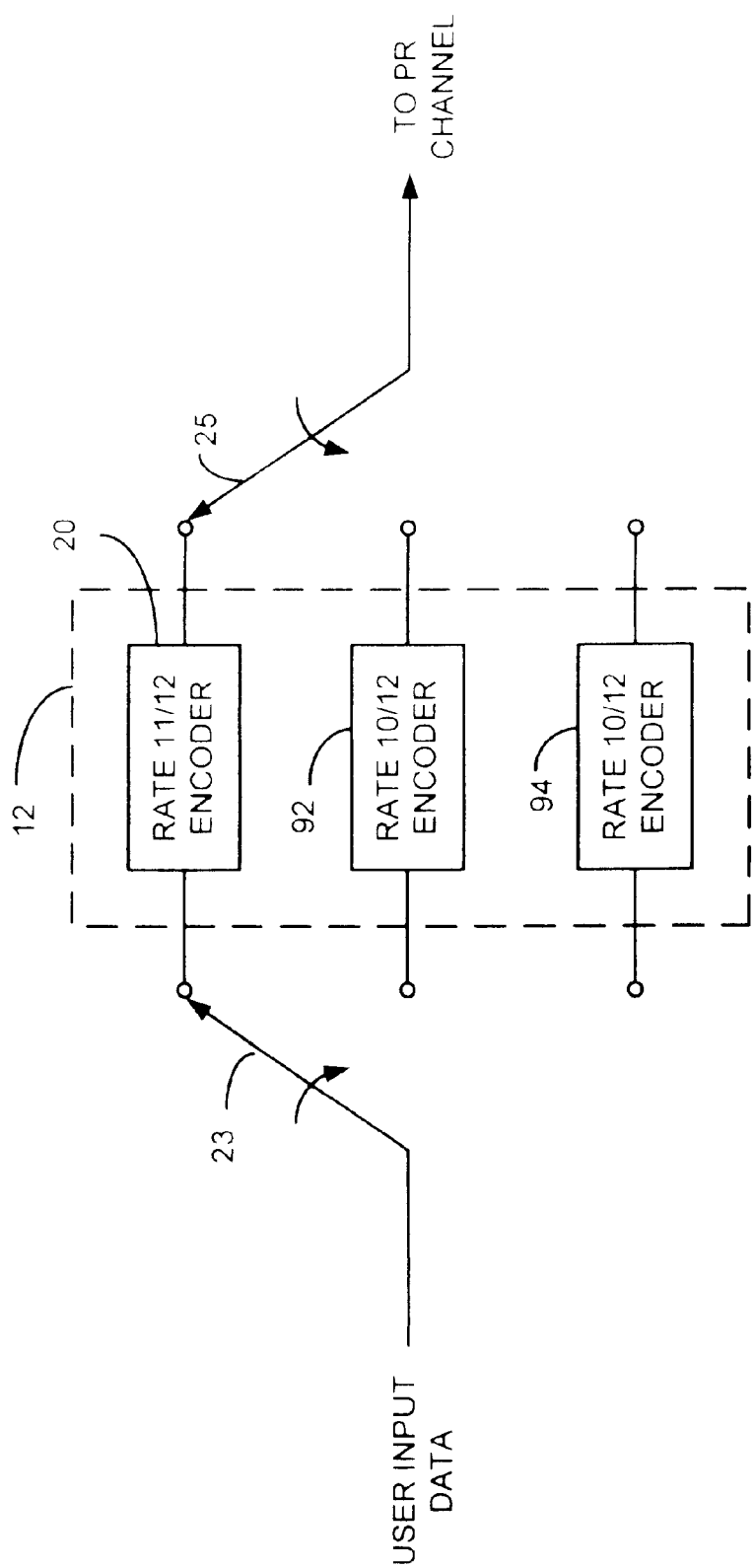
FIG. 11 is a block diagram of a second embodiment of an encoder in accordance with one aspect of the present invention.

FIG. 11 is a block diagram of encoder 12 according to a second preferred embodiment of the present invention. In FIG. 11, encoder 12 includes rate 11/12 encoder 20 (first described with respect to FIG. 2). However, encoder 12, in FIG. 11, also includes at least one rate 10/12 encoder 92, and may optionally include an additional rate 10/12 encoder 94. In this second preferred embodiment, the trellis code is still described as a rate 8/9 code. However, rather than having a plurality of rate 11/12 encoded sub-blocks terminated by a single rate 6/9 encoded sub-block, the second embodiment of the present invention includes four rate 11/12 encoded sub-blocks followed by two rate 10/12 encoded sub-blocks to obtain an overall code rate of 8/9.

Thus, as data sub-blocks are provided to encoder 12, switches 23 and 25 are operated, in one embodiment, to provide data for four consecutive sub-blocks to rate 11/12 encoder 20 and then for two consecutive sub-blocks to rate 10/12 encoder 92. In a second embodiment, switches 24 and 26 are operated to provide data for four consecutive sub-blocks to rate 11/12 encoder 20 and the next sub-block to rate 10/12 encoder 92, and the final sub-block to rate 10/12 encoder 94, and to then again return to rate 11/12 encoder 20. The switching functions illustrated by switches 23 and 25 are preferably implemented using the multiplexer, interleaver-serializer, sequencer and pre-coder arrangement shown in FIG. 2.

Figure 12:
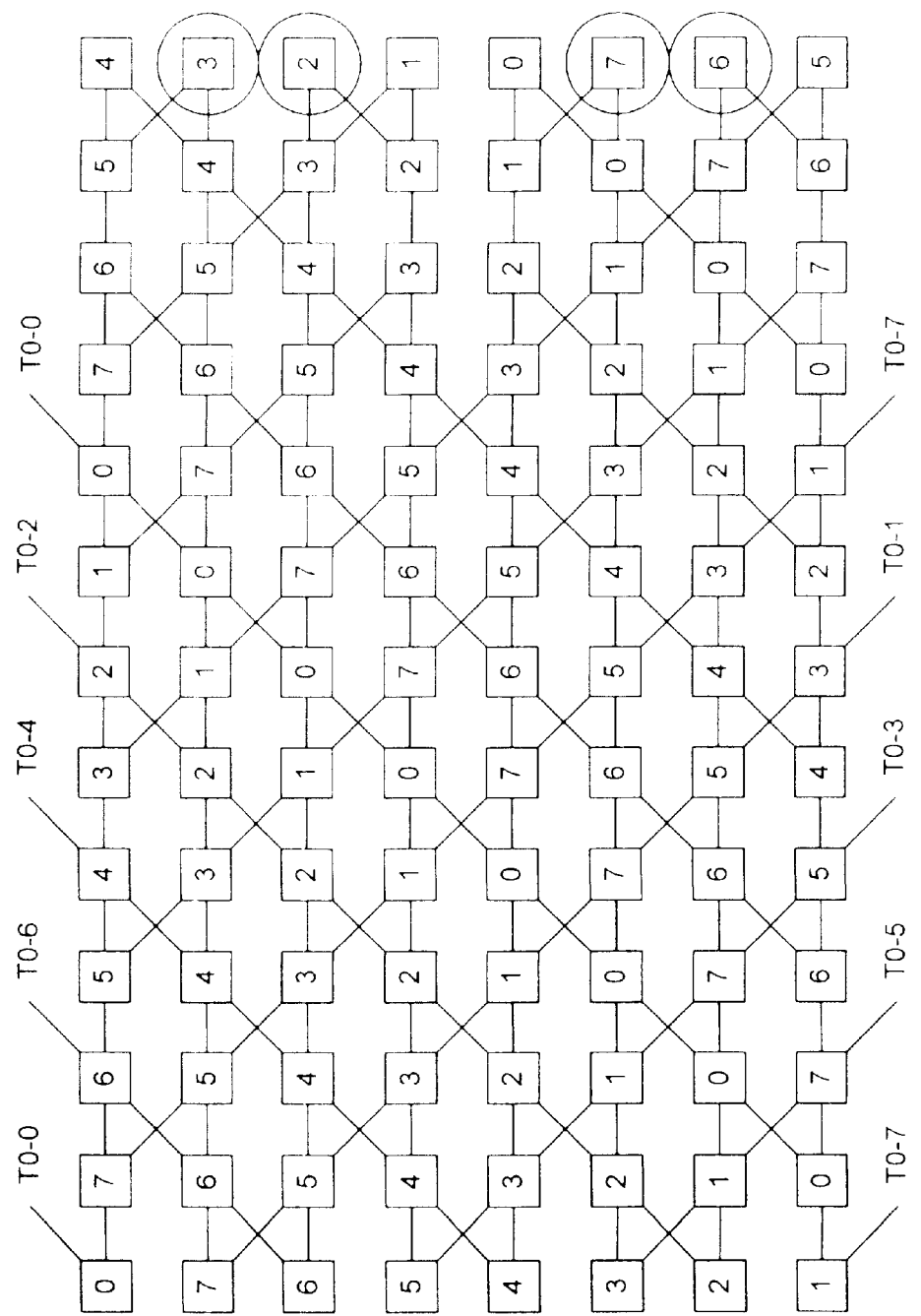
FIG. 12 illustrates a trellis structure for a next to last rate 10/12 encoded sub-block.
Figure 13:
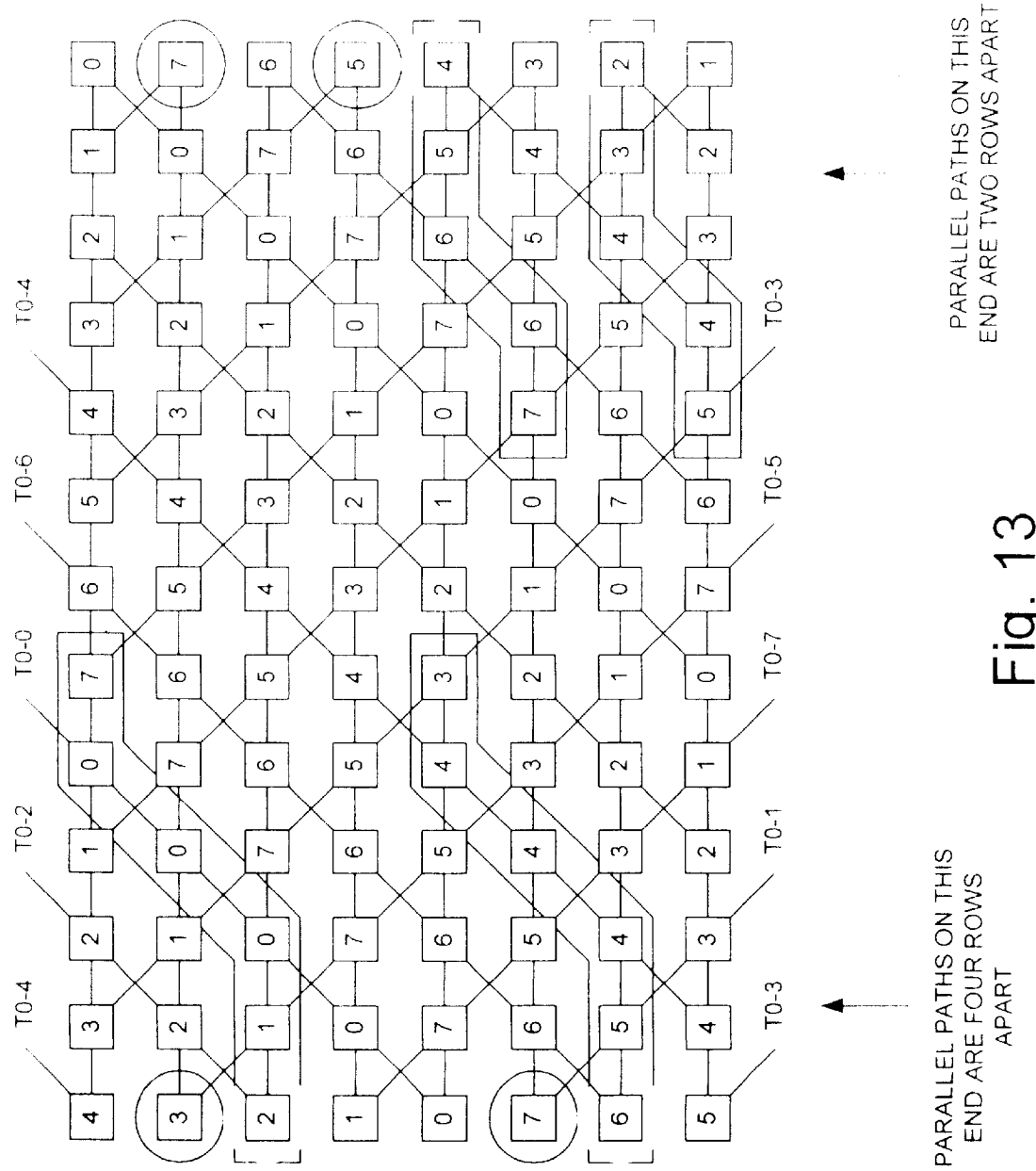
FIG. 13 illustrates a trellis structure for a last rate 10/12 encoded sub-block.

FIGS. 12 and 13 illustrate the trellis structure to which the decoder is designed, illustrating the second to last, and last sub-blocks. For the first terminating sub-block of rate 10/12, FIG. 12 illustrates the trellis structure. It should be noted that, at the input to the trellis structure illustrated in FIG. 12, all states in the trellis structure are possible. However, at the output of the trellis structure, only four states are possible. In the embodiment shown in FIG. 12, the possible states include states 2, 3, 6 and 7. This is indicated by thicker lines entering those state symbols, along with the shaded circles around those symbols in FIG. 12.

FIG. 13 illustrates the final sub-block for each code block in accordance with the second sub-block in which a rate 10/12 sub-block is encoded. At the input to the trellis structure in FIG. 13, four states are possible. Also, at the output of the trellis structure in FIG. 13, four states are possible.

However, it should be noted that parallel paths which do not violate the k constraint and run length constraints of the code, at the input side of the trellis structure in FIG. 13, are four rows apart. At the output of the trellis structure illustrated in FIG. 13 the parallel paths which meet the desired constraints can only be two rows apart. Therefore, at some point in the final sub-block of the code block (as illustrated by the trellis structure in FIG. 13) any quasicatastrophic parallel paths which have occurred, must become nonparallel and therefore must terminate. Of course, the detector for implementing the code can be designed in a suitable way, such as that described with respect to the first code. Also, the encoder and decoder are also preferably made in a similar fashion. Table 5 illustrates one embodiment of an encoder which is defined in the Verilog design language.

Also, it should be noted that while this embodiment has been described with respect to encoding four sub-blocks at rate 11/12 and terminating the code block by encoding two sub-blocks at rate 10/12, any suitable number, J, of sub-blocks can be encoded at rate 11/12 followed by two terminating sub-blocks of rate 10/12. Table 5 illustrates a number of embodiments for different values of J, the number of user bits per bits encoded, along with the coded block length, and the associated code rate.

It should also be noted that, in accordance with the preferred embodiment of the present invention, and in order to make it more optimal decision in the trellis code, it is desirable to guarantee that diverging sequences obtain the minimum distance of the code, and that the minimum metric state is selected as the output of the selected path. The complexity of choosing the minimum metric path is reduced if a decision is made shortly after the end of a code block, thereby reducing the number of metrics that need to be compared.

Figure 14:
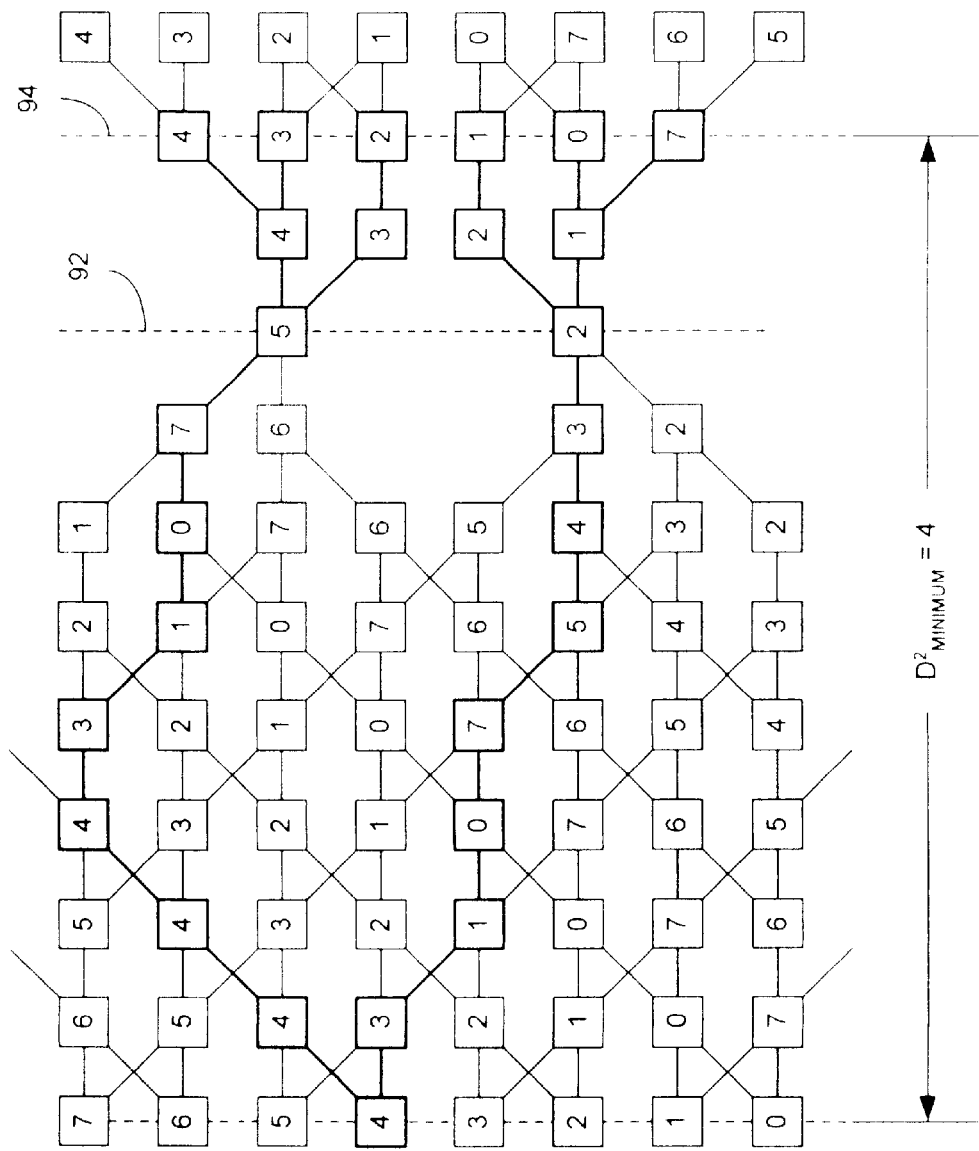
FIG. 14 illustrates a trellis structure showing a preferred method of output state selection.

FIG. 14 illustrates a diverging pair of coded sequences, and another trellis sequence at block boundaries. The block boundary is illustrated by dashed vertical line 92, for the first code which ends in a rate 6/9 encoded sub-block, and in which states 2 and 5 are the only allowable states for termination of a code block. In one preferred embodiment, the minimum metric through the trellis is determined only two states after the code boundary, illustrated by the vertical dashed line 94.

Figure 15:
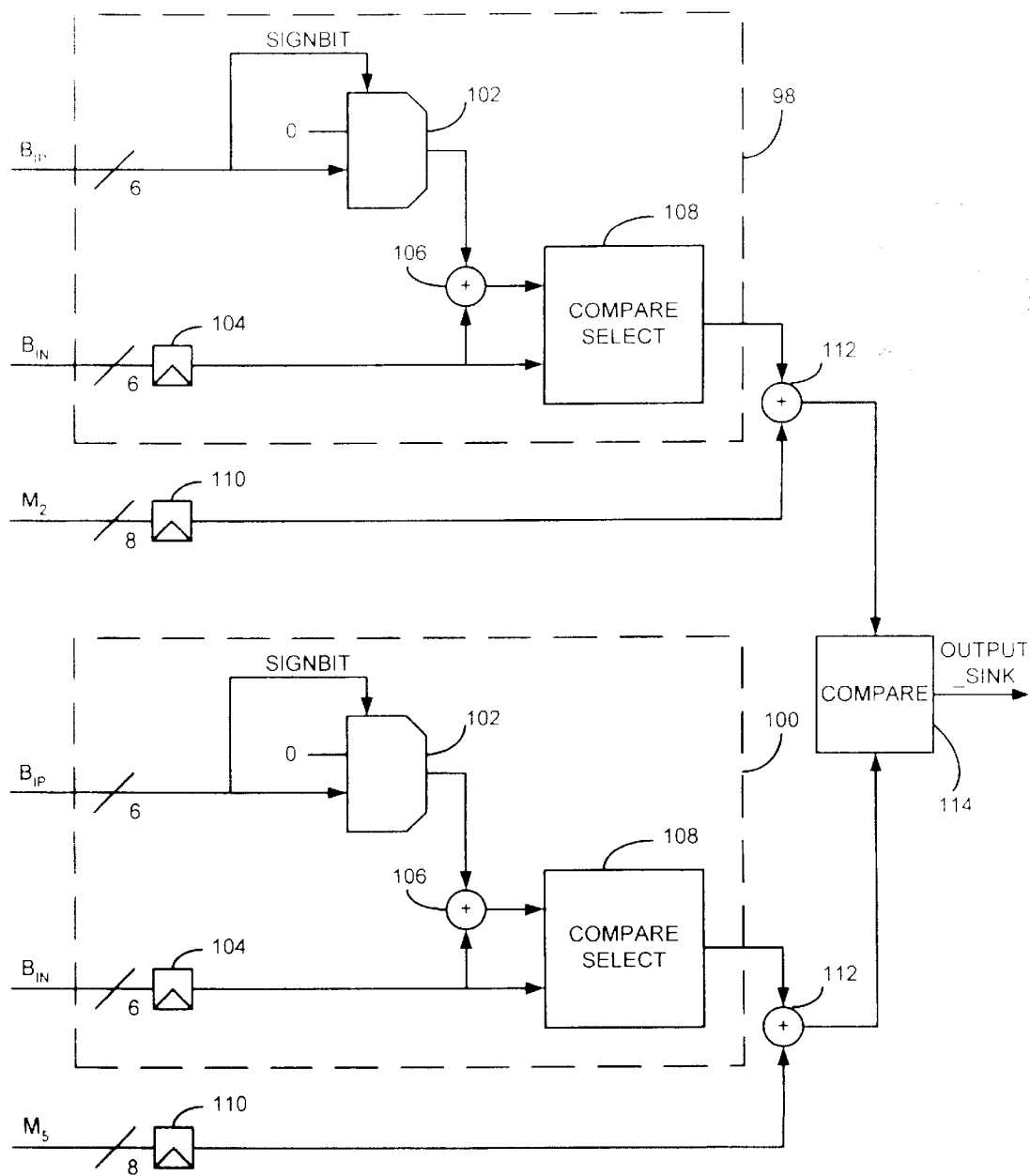
FIG. 15 illustrates a detector implementing the selection method shown in FIG. 14.
Figure 16:
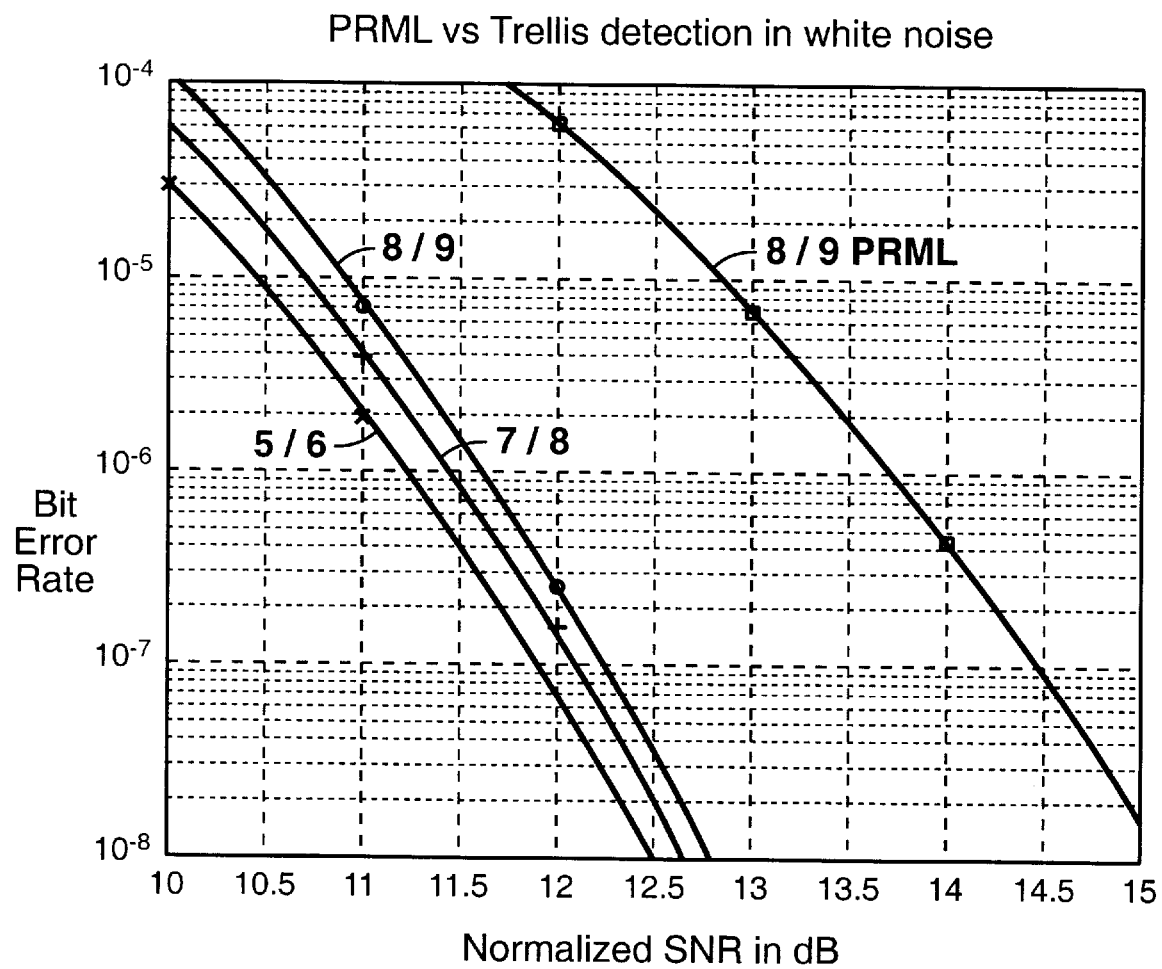
FIG. 16 illustrates simulated performance results of one embodiment of the present invention.

FIG. 15 illustrates one preferred embodiment of a circuit for deciding the proper output state. output detection circuit 96, disclosed in FIG. 16, includes first circuit 98 for determining a minimum metric path extension for state 2, and second circuit 100 for determining a minimum metric path extension for state 5. Each of circuits 98 and 100 include input multiplexers 102, input register 104, adder 106, and compare and select circuit 108. The state metrics for each state are stored in input registers 110. The branch metrics $B_{in}$ and $B_{ip}$ are provided to circuits 98 and 100 for each state as well. The branch metric $B_{iz}$ is 0, and thus need not be independently provided as an input, but can be provided as a fixed value. The lowest branch metric is chosen by the circuits 98 and 100 by multiplexers 102 (with the sign of the branch metric $B_{ip}$ acting as a select bit in the multiplexer), and by compare and select circuit 108. The lowest branch metric is then added to the state metric for the relevant state by adders 112. The new values for the relevant metrics, after emerging from adders 112, are provided to compare circuit 114, which chooses the lowest of the two and provides it as the output sink signal.

FIG. 16 illustrates simulated performance results of the code illustrated by the trellis structure set out in FIGS. 12 and 13, as bit error rate plotted against normalized signal-to-noise ratio in decibels. The simulated results are shown at rates 20/24, 42/48 and 64/72 versus a rate 8/9 PRML detector.

It can thus be seen that the present invention provides numerous advantages over prior art systems. For instance, the present invention provides a high rate trellis code, yet provides it in such a way that the encoder and decoder functions can be implemented with acceptable complexity. The constraints and minimum distance of the present code are also advantageous over prior systems. Further, a code implemented using the path memory architecture and trellis structure of the present invention provides a significant reduction in power required for prior detectors.

Although the present invention has been described with reference to preferred embodiments, workers skilled in the art will recognize that changes may be made in form and detail without departing from the spirit and scope of the invention.

What is claimed is:

1. A method of detecting uncoded input data, comprising:
   using an encoder to encode signals indicative of the unencoded input data into a plurality of encoded sequences, a first subset of the plurality of encoded sequences, each sequence in the first subset having a preselected length, being encoded according to a k constrained code of rate x/y and a second subset of the plurality of encoded sequences, each sequence in the second subset having a preselected length, being encoded according to a k constrained code of rate m/n wherein x/y≠m/n and wherein switching between encoding at rates m/n and x/y is done on predetermined intervals; channel subject to noise; and
   transmitting the encoded sequences from the channel to a Viterbi detector having a trellis structure with a preselected, time-dependent pattern to create a time varying trellis structure for limiting a maximum length of parallel paths there through;
   detecting the encoded sequences with the Viterbi detector to provide detected, encoded sequences; and
   decoding the detected, encoded sequences to provide an estimate of the input data.

2. The method of claim 1 wherein using an encoder to encode the signals comprises:
   encoding the signals according to a code such that x/y>m/n.

3. The method of claim 2 wherein the code has an overall code rate for all of the first and second subsets of rate 8/9.

4. The method of claim 2 wherein the codes used to encode the first and second subsets are constrained to be freely concatenated without violating the k constraint.

5. The method of claim 4 wherein the codes used to encode the first and second subsets are (0,3) codes.

6. The method of claim 5 wherein the codes used to encode the first and second subsets is a rate 8/9 code constrained to (0,6/3).

7. The method of claim 1 wherein the second subset of encoded sequences is encoded such that a final state in the trellis structure, after the second subset is detected, corresponds to one of a plurality of preselected codeblock terminating states.

8. The method of claim 7 wherein the second subset is encoded using at least one codeword selected based on a state in the trellis structure which the Viterbi detector will be placed in after the first subset is detected, and based on at least one of the plurality of preselected codeblock terminating states.

9. The method of claim 1 wherein the first subset of the plurality of sequences comprises J sequences encoded at a rate of 11/12.

10. The method of claim 9 wherein the second subset of the plurality of sequences comprises one sequence encoded at a rate of 6/9.

11. The method of claim 9 wherein the second subset of the plurality of sequences comprises two sequences encoded at a rate of 10/12.

12. An apparatus for encoding and detecting input data, comprising:

an encoder configured to receive and encode the input data into a plurality of k constrained, encoded sequences such that at least two of the encoded sequences are encoded according to codes having different code rates wherein the encoder is configured to switch between encoding at the different code rates at predetermined intervals;

a partial response channel, coupled to receive the encoded sequences, the partial response channel being subject to noise;

a detector configured to receive and detect the encoded sequences from the partial response channel and operating according to a preselected, time dependent trellis structure having stages associated with successive time periods, the time dependent trellis structure operating to eliminate maximum length parallel paths there through; and a decoder coupled to the detector and configured to receive and decode the encoded sequences.

13. The apparatus of claim 12 wherein the encoder is configured to encode the input data into codewords, each codeword comprising:

a first subset of J encoded sequences at a code rate of x/y and a second subset of L encoded sequences at a code rate of m/n wherein x/y>m/n.

14. The apparatus of claim 13 wherein the detector comprises:

a selection circuit associated with each of a plurality of states in the trellis structure, each selection circuit being configured to select path data indicative of a most likely path through the trellis structure to its associated state, and pointer data indicative of a source state for the most likely path;

a local path memory (LPM) associated with each of the plurality of states in the trellis structure, the LPM being configured to receive and store the path data associated with an encoded sequence then being provided to the detector, each LPM being further configured to receive and store the pointer data; and a global path memory (GPM), coupled to the local path memory, configured to receive and store the path data and pointer data associated with each sequence, the GPM receiving the path data and pointer data for the sequence once the path and pointer data has been finally selected for the sequence.

15. The apparatus of claim 14 wherein the GPM further comprises:

a number N=J+L registers, each register being wide enough to accommodate the path data and the pointer data for a sequence, the registers being configured to receive and transfer the path and pointer data for sequential sequences from one register to a next register as an N-stage delay line.

16. The apparatus of claim 15 wherein the encoder is configured to encode the second subset of encoded sequences such that a final state in the trellis structure, after the second subset is detected, corresponds to one of a plurality of preselected codeblock terminating states in the trellis structure.

17. The apparatus of claim 16 wherein the encoder is configured to encode the second subset using at least one sequence selected based on a state in the trellis structure which the detector will be placed in after the first subset is detected, and based on at least one of the plurality of preselected codeblock terminating states.

18. The apparatus of claim 16 wherein the detector further comprises:

a global source selection circuit, coupled to a portion of the GPM storing the pointer data, and configured to select a source of a most likely path from one of the preselected codeblock terminating states through each subset in the codeword to obtain a global path indicative of a most likely path through the trellis structure for the entire codeword and thus indicative of the codeword.

19. The apparatus of claim 18 wherein the global source selection circuit comprises:

a plurality of multiplexers coupled to the portion of the GPM storing the pointer data, each multiplexer having as inputs thereof pointer data associated with each state for a sequence;

a terminal pointer multiplexer having as inputs thereof pointer data associated with each of the codeblock terminating states; and wherein pointer data provided at the output of the terminal pointer multiplexer is coupled, as a select input, to a first subsequent of the plurality of multiplexers, and wherein a plurality of a remainder of the multiplexers each have outputs thereof coupled as a select input to a next subsequent multiplexer.

20. The apparatus of claim 19 wherein the detector further comprises:

a path data selection circuit, coupled to a portion of the GPM storing the path data; and a gating circuit, coupled to the outputs of the multiplexers and the output of the terminal pointer multiplexer, to selectively apply pointer data associated with each sequence to the path data selection circuit, the path data selection circuit selecting the path data associated with the sequence based on the pointer data applied by the gating circuit.

21. The apparatus of claim 12 wherein the trellis structure is made up of a plurality of states at each stage and at least one edge associated with each state and wherein the detector comprises:

a bias circuit configured to eliminate certain states and edges from the trellis structure in a time dependent manner; and a dynamic bias circuit configured to enforce run length constraints on the detector.

22. The apparatus of claim 12 wherein the encoder comprises:

a first encoding portion configured to encode a first portion of the unencoded input data into a first subset of encoded sequences according to a first code having a code rate x/y;

a second encoding portion configured to encode a second portion of the unencoded input data into a second subset of encoded sequences according to a second code having a code rate m/n, wherein m/n<x/y; and a switching portion coupled to the first and second encoding portions and configured to periodically switch between enabling the first and second encoding portions to obtain the first and second subsets of encoded sequences.

23. The apparatus of claim 13 wherein the encoder encodes the data such that each codeword has an overall code rate of 8/9.

24. The apparatus of claim 23 wherein the encoder encodes the first and second subsets using a k constrained code and wherein the encoder encodes the data in a constrained fashion to be freely concatenated without violating the k constraint.

25. The apparatus of claim 24 wherein the encoder encodes the first and second subsets using (0,3) codes.

26. The apparatus of claim 25 wherein the encoder encodes the first and second subsets using a rate 8/9 code constrained to (0,6/3).

27. The apparatus of claim 13 wherein the first subset of the plurality of sequences comprises J sequences encoded at a rate of 11/12.

28. The apparatus of claim 27 wherein the second subset of the plurality of sequences comprises one sequence encoded at a rate of 6/9.

29. The apparatus of claim 27 wherein the second subset of the plurality of sequences comprises two sequences encoded at a rate of 10/12.

* * * * *

UNITED STATES PATENT AND TRADEMARK OFFICE
CERTIFICATE OF CORRECTION

PATENT NO. : 6,233,289 B1 Page 1 of 1
DATED : May 15, 2001
INVENTOR(S) : Fredrickson It is certified that error appears in the above-identified patent and that said Letters Patent is hereby corrected as shown below:

Title page,
Item [56], Title, before "HIGH" insert -- IMPROVED --
Item [73], Assignee, delete "Inc." and insert -- LLC --

Column 12,
Line 14, "uncoded" should be -- unencoded --
Line 27, should be new paragraph after "intervals;"
Line 27, insert -- transmitting the encoded sequences to a partial response -- before "channel"
Line 31, "there through" should be -- therethrough --

Column 13,
Lines 21-22, "there through" should be -- therethrough --

Signed and Sealed this

Twenty-seventh Day of July, 2004

JON W. DUDAS
*Acting Director of the United States Patent and Trademark Office*